United States Patent [19]

Matsumoto

[11] Patent Number: 4,698,527
[45] Date of Patent: Oct. 6, 1987

[54] TTL-ECL LEVEL CONVERTER OPERABLE WITH SMALL TIME DELAY BY CONTROLLING SATURATION

[75] Inventor: Kouji Matsumoto, Toyko, Japan

[73] Assignee: NEC Corporation, Tokyo, Japan

[21] Appl. No.: 925,577

[22] Filed: Oct. 31, 1986

[30] Foreign Application Priority Data

Oct. 31, 1985 [JP] Japan .................................. 60-245404

[51] Int. Cl.[4] ................. H03K 19/013; H03K 19/086; H03K 19/092
[52] U.S. Cl. .................................... 307/475; 307/443; 307/455; 307/362; 307/549; 307/551; 307/300
[58] Field of Search ................ 307/443, 455, 456–457, 307/460, 475, 494, 362, 264, 300, 551, 559, 561, 549

[56] References Cited

U.S. PATENT DOCUMENTS

| | | | |
|---|---|---|---|
| 4,356,409 | 10/1982 | Masuda et al. | 307/455 X |
| 4,437,021 | 3/1984 | Sumi et al. | 307/300 X |
| 4,518,876 | 5/1985 | Constantinescu | 307/475 |
| 4,527,079 | 7/1985 | Thompson | 307/475 |
| 4,607,177 | 8/1986 | Lechner | 307/475 |
| 4,612,460 | 9/1986 | Gloaguen et al. | 307/475 |
| 4,620,115 | 10/1986 | Lee et al. | 307/475 X |
| 4,654,549 | 3/1987 | Hannington | 307/443 X |

OTHER PUBLICATIONS

Gersbach, "TTL Emitter-Coupled Logic Converter", IBM T.D.B., vol. 19, No. 1, Jun. 1976, p. 22 (307/475).
Bond, "TTL-To-ECL Logic Level Converter", IBM T.D.B., vol. 20, No. 10, Mar. 1978, p. 3976 (307/475).

*Primary Examiner*—Stanley D. Miller
*Assistant Examiner*—D. R. Hudspeth
*Attorney, Agent, or Firm*—Sughrue, Mion, Zinn, Macpeak, and Seas

[57] ABSTRACT

A TTL-ECL signal level converter includes: an input terminal receiving an input TTL signal; an input diode having a cathode connected to the input terminal; an input transistor having a collector connected to a positive power source, a base connected to an anode of the input diode and grounded through a first series connection of diodes and an emmiter connected to a negative power source through a second series connection of diodes and a current source; a reference voltage source; a clamping transistor having a collector grounded, a base receiving the reference voltage and an emitter connected to a connection point of the second series connection and the current source; and a comparing means for comparing a voltage at the connection point of the second series connection and the current source with the reference voltage, the comparing means producing an output ECL signal as a result of the comparison.

11 Claims, 3 Drawing Figures

TTL-ECL LEVEL CONVERTER OPERABLE WITH SMALL TIME DELAY BY CONTROLLING SATURATION

BACKGROUND OF THE INVENTION

1. Field of the Invention:

This invention relates to a circuit of a signal level converter, and more particularly to a level converter circuit converting a TTL (Transistor-Transistor Logic)-level signal to an ECL (Emitter-coupled Logic)-level signal.

2. Description of the Related Art:

The TTL-ECL level converter in the prior art used a positive power source supplying a power voltage for driving a TTL logic circuit, for example +5 volts, and a negative power source supplying a power voltage for driving an ECL logic circuit, for example −4.5 volts or −5.2 volts, together with a grounding potential. An input TTL signal is applied to a cathode of an input diode. The signal at the anode of the input diode is in turn applied to a base of an input transistor which is biased by a resistor or resistors connected to the positive power source. The collector of the input transistor is connected to the positive power source directly or through one of the resistors. The emitter of the input transistor is grounded through three diodes on one way and connected to a base of a buffer transistor through two of the three diodes and a resistor on the other way. The buffer transistor is grounded at its collector and connected at its emitter to the negative power source through a resistor. The signal level at the emitter of the buffer transistor is compared by a differential amplifier with a reference voltage which is a threshold voltage of the ECL circuit. The differential amplifier is also driven by the negative power source. The comparison result is derived through an emitter follower as an ECL signal. The emitter follower is also driven by the negative power source.

When the TTL input signal has a low level, the capacitance component of the input diode is charged with a current flowing through the positive power source—the resistor or resistors connected between the positive power source and the base of the input transistor—the input diode—the grounding point. The charges charged in the capacitance component of the input diode are discharged through the input transistor, when the TTL input signal changes to have a high level. Here, since the emitter of the input transistor is grounded through the three diodes, but the base thereof does not have a direct connection to the grounding point, the input transistor has a large input impedance. Therefore, a large time period is necessary to completely discharge the capacitance component of the input diode. Thus, a large time delay appears on the ECL output signal, when the input signal changes from a low level to a high level.

Besides, the discharging current also flows through the resistor or resistors biasing the base of the input transistor to the positive power source. In this current path, the voltage at the base of the input transistor momentally rises to a voltage which is an added value of the raised voltage of the input signal and the precharged voltage of the input diode. At this moment, the input transistor is driven into a saturation condition. If the transistor is saturated, a charge-storage is generated in the transistor and a new time delay appears when the input signal changes from a high level to a low level.

SUMMARY OF THE INVENTION

The primary object of the present invention is to provide a level converter having a small time delay in an output signal and being operable at high speed.

It is another object of the present invention to provide a TTL-ECL level converter operable at high speed.

The level converter according to the present invention comprises a positive power supply line, a grounding line, a negative power supply line, an input terminal receiving an input signal, the input signal changing between high and low levels, an input diode having a cathode connected to the input terminal and an anode, an input transistor having a base connected to the anode of the input diode, a collector receiving a positive voltage from the positive power supply line, and an emitter, a first series connection of diodes between the base of the input transistor and the grounding line, a second series connection of diodes having one end connected to the emitter of the input transistor, the diodes in the first and second series being forward biased when the input signal is in the high level, a current source connected between the other end of the second series connection of diodes and the negative power supply line to feed a current to the second series connection of diodes, a source of a reference voltage for an ECL signal, a clamping transistor having a collector connected to the grounding line, an emitter connected to the other end of the second series connection of diodes, and a base receiving the reference voltage, a comparator comparing the signal at the other end of the second series connection of diodes with the reference voltage and being energized by a power voltage between the grounding line and the negative power supply line, and a means for producing an ECL output signal from the comparison result of the comparator.

According to the present invention, the first series connection of diodes is provided between the base of the input transistor and the grounding line. When the input signal changes from a low level to a high level, the diodes in the first series connection are forward-biased and have a small impedance to quickly discharge the charges in the capacitance component of the input diode. Therefore, the discharging time period is very short to minimize the delay time of the ECL output signal. Furthermore, since the first series connection of diodes clamps the base voltage of the input transistor by being forward-biased, the input transistor is not driven into a saturation condition. No charge-storage occurs in the input transistor. In other words, any time delay due to the charge-storage in the input transistor is not also generated, when the input signal changes from a high level to a low level.

BRIEF DESCRIPTION OF THE DRAWINGS

The objects, features and advantages of the present invention will be better understood from the following detailed description taken in conjunction with the accompanying drawings wherein.

Figure 1:
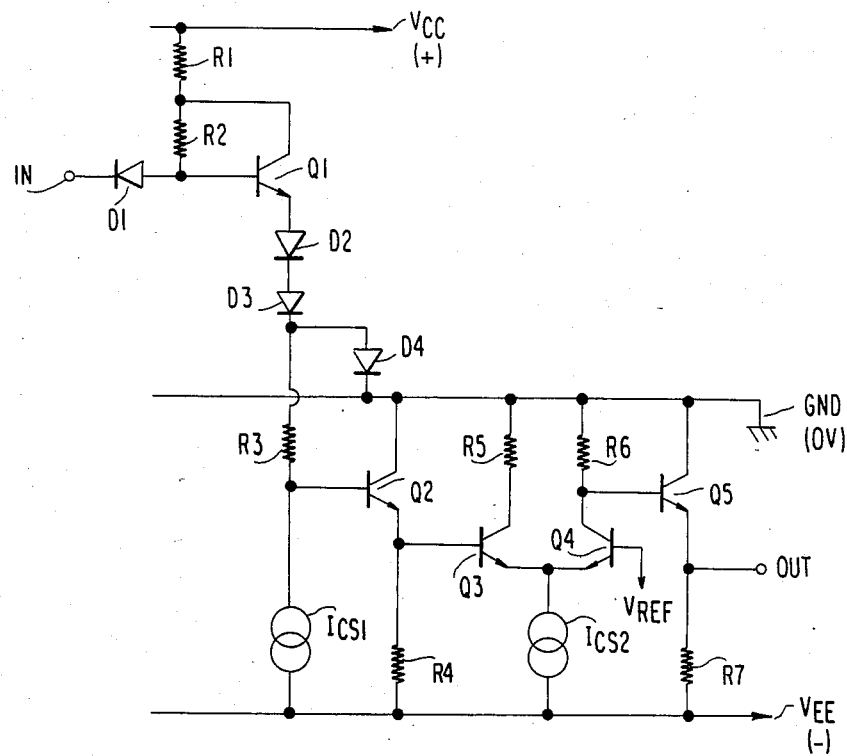
FIG. 1 is a circuit diagram of a TTL-ECL converter in the prior art.

A TTL-ECL converter in the prior art shown in FIG. 1 receives an input signal having a TTL signal level, at an input terminal IN to which a cathode of an input diode D1 is connected. An anode of the input diode D1 is connected to a positive power supply line Vcc (+5 volts, for example) through resistors R1 and R2 and to a base of an input transistor $Q_1$ having a collector connected to a connection point of the resistors R1 and R2. An emitter of the input transistor $Q_1$ is grounded through a series connection of diodes $D_2$, $D_3$ and $D_4$. The connection point of the diodes $D_3$ and $D_4$ is connected to the negative power supply line $V_{EE}$ (−4.5 volts or −5.2 volts, for example) through a resistor $R_3$ and a constant current source $I_{CS1}$. The connection point of the resistor $R_3$ and the constant current source $I_{CS1}$ is connected to a base of an emitter follower transistor $Q_2$ having a grounded collector and an emitter connected to an emitter resistor $R_4$. The emitter of the transistor $Q_2$ is also connected to a base of a transistor $Q_3$ which forms a differential amplifier operating as a comparator with a transistor $Q_4$, a constant current source $I_{CS2}$ and resistors $R_5$ and $R_6$. A reference voltage $V_{ref}$ for ECL signal, about −1.3 volts for example, is applied to the base of the transistor $Q_4$ and is compared with the signal at the emitter of the transistor $Q_2$. The comparison result obtained at the collector of the transistor $Q_4$ is applied to an emitter follower output stage of a transistor $Q_5$ and an emitter resistor $R_7$ and derived as an ECL output signal from the output terminal OUT connected to the emitter of the transistor $Q_5$.

The reference voltage $V_{ref}$ for an ECL signal is about −1.3 volts and is designed to a voltage difference between the emitter of the transistor $Q_2$ and the connection point of the diodes $D_3$ and $D_4$. The transistor $Q_1$ turns on, when the input signal at the input terminal becomes larger than the double of a forward-bias voltage of a PN-junction diode, which is about +1.3 volts. Therefore, the transistor $Q_1$ turns on and off by a TTL level input signal to swing the level at the emitter of the transistor $Q_2$ above and below the reference voltage $V_{ref}$. If the emitter resistor $R_7$ is adequately designed, the signal obtained at the output terminal OUT has an ECL level. Thus, the converter shown in FIG. 1 operates as a TTL-ECL level converter.

The above-explained TTL-ECL converter in the prior art has some disadvantages which will be explained. When the input signal has a TTL low level, a current from the positive power line $V_{cc}$ flows to the input terminal IN through the resistors R1 and R2 and the input diode D1. A capacitance component of the input diode D1 is charged by the current. Thereafter, when the input signal rises to a TTL high level, the charges charged in the input diode $D_1$ are discharged through the base to emitter of the transistor $Q_1$ and the diodes $D_2$, $D_3$ and $D_4$. The base input impedance of the transistor $Q_1$, however, is very large. A large time period is spent to turn off the transistor $Q_1$ after the charges in the input diode D1 are completely discharged. This results in a time delay in the ECL output signal.

Another discharging current flows through the resistor R1 and R2 to the positive power supply line Vcc. Due to this current, the voltage drop across the resistor R2 forward biases the base collector junction of the transistor $Q_1$ to drive the transistor $Q_1$ into saturation condition at which a charge-storage occurs in the transistor $Q_1$. For this charge-storage, another time delay occurs in the ECL output signal when the input TTL signal changes from a high level to a low level.

DETAILED DESCRIPTION OF THE PREFERRED EMBODIMENTS

Figure 2:
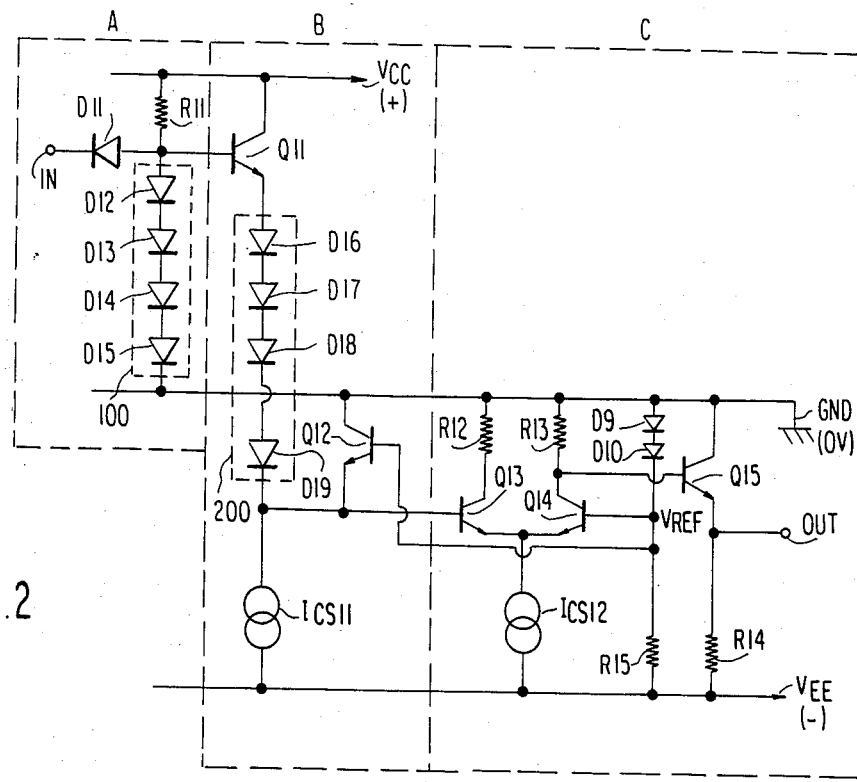
FIG. 2 is a circuit diagram of a TTL-ECL converter according to a first preferred embodiment of the present invention.

A first preferred embodiment is shown in FIG. 2 which is designed to receive a TTL input signal having a threshold voltage of about +1.3 volts. Section A is an input section of TTL level signal. Section B is a level shift section converting a positive signal to a negative signal. Section C is an ECL level control section.

A TTL input signal is applied to the input terminal IN. A cathode of an input diode $D_{11}$ is connected to the input terminal IN. An anode of the input diode $D_{11}$ is connected to a resistor $R_{11}$ and a base of an input transistor $Q_{11}$. A positive power supply line Vcc is connected to the resistor $R_{11}$ and a collector of the input terminal $Q_{11}$. A first series connection 100 of diodes $D_{12}$ to $D_{15}$ is connected between the grounding point GND and the connection point of the input diode $D_{11}$, the resistor $R_{11}$ and the base of the transistor $Q_{11}$. Each of the diodes $D_{12}$ to $D_{15}$ are connected so as to be forward biased when the input signal is a high level. An emitter of the input transistor $Q_{11}$ is connected to the negative power supply line $V_{EE}$ through a second series connection 200 of diodes $D_{16}$ to $D_{19}$ and a first constant current source $I_{CS11}$. Each of the diodes $D_{16}$ to $D_{19}$ are connected so as to be forward biased when the input signal is a high level. A clamping transistor $Q_{12}$ is grounded at a collector and connected to the connection point of the diode $D_{19}$ and the first constant current source $I_{CS11}$ at an emitter. A reference voltage $V_{ref}$ for an ECL signal is generated by a series connection of the forward-biased diodes $D_9$ and $D_{10}$ and a resistor $R_{15}$ and is about −1.3 volts. The reference voltage $V_{ref}$ is applied to the bases of the clamping transistor $Q_{12}$ and a differential transistor $Q_{14}$. A differential amplifier is constituted with the differential transistor $Q_{14}$, two resistors $R_{12}$ and $R_{13}$, a second constant current source and another differential transistor $Q_{13}$ having a base connected to the connection point of the diode $D_{19}$, the first constant current source $I_{CS11}$ and the emitter of the clamping transistor $Q_{12}$. The emitters of the two differential transistors $Q_{13}$ and $Q_{14}$ are commonly connected to the second constant current source $I_{CS12}$. The collector of the differential transistor $Q_{14}$ is connected to a base of the emitter-follower transistor $Q_{15}$ having an emitter connected to an output terminal OUT. An emitter resistor $R_{14}$ is connected between the emitter of the emitter follower transistor $Q_{15}$ and the negative power supply line $V_{EE}$.

The reference voltage $V_{ref}$ is generated by two forward biased diodes $D_9$ and $D_{10}$. Therefore, two of the diodes $D_{16}$ to $D_{19}$ in the second series connection 200 compensates the forward-biased diodes $D_9$ and $D_{10}$. The remaining two of the diodes $D_{16}$ to $D_{19}$ in the second series connection 200, the base-emitter junction of the input transistor $Q_{11}$ and the input diode $D_{11}$ determine a threshold voltage for an input voltage. Here, since the input diode $D_{11}$ compensates one of the remaining two forward-biased diodes in the second series connection 200, the threshold voltage is determined by the base-emitter junction of the input transistor $Q_{11}$ and one of the diodes $D_{16}$ to $D_{19}$ in the second series connection 200. As a result, the threshold voltage becomes about +1.3 volts. If an input signal larger than the threshold voltage is applied to the input terminal IN, the input transistor $Q_{11}$ turns on. The input transistor $Q_{11}$ turns off in response to an application of an input signal smaller than the threshold voltage to the input terminal IN. Those operation mean the circuit of FIG. 1 is applicable to receive a TTL signal.

In other words, the number of forward-biased diodes in the second series connection 200 is determined by the threshold voltage of the input TTL signal and the reference voltage for producing the output ECL signal. The number obtained by dividing the total voltage of the threshold voltage and the reference voltage by a forward-biased voltage of a PN-junction diode is the number of the forward-biased diodes in the second series connection 200. On the other hand, the number of the forward biased diodes in the first series connection 100 is determined so as to produce $-V_F$ (where $V_F$ is a forward-biased voltage of a PN-junction diode) at the base of the differential transistor $Q_{13}$. The exact number of the diodes in the first series 100 for producing such condition is the same number as the diodes in the second series connection 200.

The operation of the first preferred embodiment will now be explained. When the input signal becomes a low level of +0.4 volts which is lower than the threshold voltage of +1.3 volts, a current flows through the resistor $R_{11}$ and the input diode $D_{11}$ to the input terminal IN. At this time, the diodes $D_{12}$ to $D_{15}$ in the first series connection 100 and the input transistor $Q_{11}$ keep a cut-off condition. The voltage at the base of the differential transistor $Q_{13}$ is determined by the clamping transistor $Q_{12}$ to a value of $(V_{ref} - V_{BE})$ where $V_{BE}$ is a forward biasing voltage of the base-emitter junction of the clamping transistor $Q_{12}$. Since the reference voltage $V_{ref}$ is $-1.3$ volts, the differential transistors $Q_{13}$ and $Q_{14}$ turns off and on, respectively to produce an ECL output signal of a low level ($-1.62 \sim -1.81$ volts) at the output terminal OUT.

On the other hand, when the input signal rises to a high level of +2.8 volts, the input diode $D_{11}$ becomes a cut-off condition. A current from the resistor $R_{11}$ flows into the base of the input transistor $Q_{11}$. The input transistor turns on to forward bias the diodes $D_{16}$ to $D_{19}$ in the second series connection 200. Since the numbers of the diodes in the first and second series connections 100 and 200 are the same, the voltage at the base of the differential transistor $Q_3$ becomes $-V_F$ which is a forward-biased voltage of the PN-junction diode. The differential transistors $Q_{13}$ and $Q_{14}$ turns on and off, respectively, to produce an ECL output signal of a high level ($-0.88 \sim -1.025$ volts) at the output terminal OUT.

The capacitance component of the input diode $D_{11}$ is charged during the input signal is at a low level. Thereafter, when the input signal rises to a high level, the charges flow through the first series connection 100 of diodes $D_{12}$ to $D_{15}$ which are forward biased by the high level of the input signal to show a low impedance. The time for discharging is very short. A very small time delay appears on the output signal at the output terminal OUT. Furthermore, the first series connection 100 of diodes $D_{12}$ to $D_{15}$ clamps the voltage at the base of the input transistor $Q_{11}$. The input transistor $Q_{11}$ is not driven into a saturation condition and does not produce a charge-storage. Therefore, there is no time delay when the input signal changes flow a high level to a low level.

Figure 3:
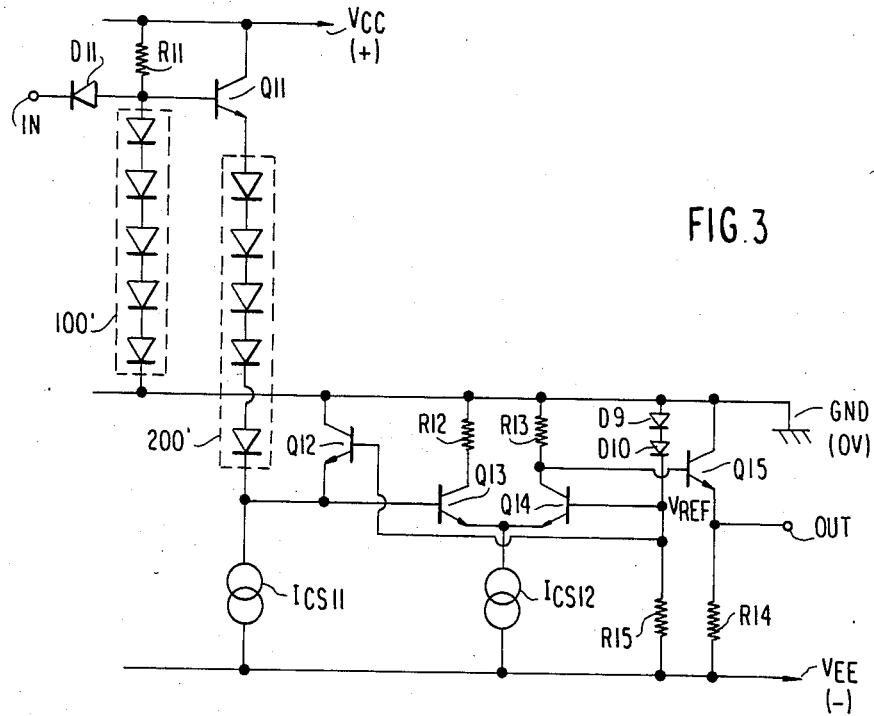
FIG. 3 is a circuit diagram of a TTL-ECL converter according to a second preferred embodiment of the present invention.

Referring now to FIG. 3 showing a second preferred embodiment, the threshold voltage for the input signal is designed as +2.1 volts which corresponds to a triple of the forward voltage $V_F$ of a PN-junction diode. Only the difference from the first preferred embodiment shown in FIG. 2 is a part which determines the threshold voltage. Namely, the numbers of the first and second series connections 100' and 200' of diodes are respectively five. The circuit configuration other than the first and second series connections 100' and 200' is the same as the first preferred embodiment shown in FIG. 2.

Since the reference voltage $V_{ref}$ is generated by forward-biased diodes $D_9$ and $D_{10}$, the reference voltage $V_{ref}$ is compensated by two of diodes in the second series connection 200'. The forward voltage of the input diode $D_{11}$ is compensated by another of the diodes in the second series connection 200'. As a result, the threshold voltage for the input signal applied to the input terminal IN is determined by the remaining two of the diodes in the second series connection 200' and the base-emitter junction of the input transistor $Q_{11}$ and is +2.1 volts.

Similar to the first preferred embodiment shown in FIG. 2, the first series connection 100' of diodes presents a low impedance discharging function of charges in the input diode $D_{11}$ and a clamping function at the base of the input transistor $Q_{11}$. The discharge of the charges in the input diode $D_{11}$ is very quickly, and then a very short time delay is given to the output signal at the output terminal OUT, when the input signal changes from a low level to a high level. The input transistor $Q_{11}$ is not driven into a saturation condition, and then no time delay is given to the output signal, when the input signal changes from a high level to a low level.

The present invention is not apparently limited to the above-explained embodiments. The numbers of diodes in the first and second serieses may be changed in accordance with a required threshold voltage for the input signal. However, it is very practical to use four or five as the number of diodes, when a TTL signal is applied as the input signal. The base of the emitter follower transistor $Q_{15}$ may be connected to the collector of the differential transistor $Q_{13}$ in place of the collector of the differential transistor $Q_{14}$ to obtain an output signal having an opposite place to the input signal.

What is claimed is:

1. A signal level converter comprising:
   a positive power supply line;
   a grounding line;
   a negative power supply line;
   an input terminal receiving an input signal, said input signal having low and high logic levels;
   an input diode connected to said input terminal at a cathode and having an anode;
   an input transistor having a collector connected to said positive power supply line, a base connected to said anode of said input diode and an emitter;
   a first series connection of diodes between said anode of said input diode and said grounding line, said diodes in said first series connection being forward-biased when said input signal is at said high logic level;
   a second series connection of diodes coupled at one end to said emitter of said input transistor and having an other end;
   a current source connected between said other end of said second series connection and said grounding line, said diodes in said second series connection being forward-biased when said input signal is at said high logic level;

a voltage source generating a reference voltage;

a clamping transistor having a collector connected to said grounding line, a base receiving said reference voltage and an emitter connected to said other end of said second series connection; and a comparing means for comparing a voltage at said other end of said second series connection with said reference voltage, said comparing means being energized by a power voltage between said negative power supply line and said grounding line, and producing an output signal as a result of comparison.

2. A signal level converter as claimed in claim 1, wherein said comparing means includes an output terminal and a differential amplifier having a first input node receiving said voltage at said other end of said second series connection, a second input node receiving said reference voltage and an output node coupled to said output terminal.

3. A signal level converter as claimed in claim 2, wherein said comparing means further includes an emitter follower stage having an input node connected to said output node of said differential amplifier and an output node connected to said output terminal.

4. A signal level converter as claimed in claim 1, wherein said voltage source includes a third series connection of two diodes having one end connected to said grounding line and a resistive element connected between another end of said third series connection and said negative power supply line, said two diodes in said third series connection being forward biased, and said reference voltage being produced at a connection point of said third series connection and said resistive element.

5. A signal level converter as claimed in claim 4, wherein the number of diodes in each of said first and second series connections is four.

6. A signal level converter as claimed in claim 4, wherein the number of diodes in each of said first and second series connections is five.

7. A signal level converter as claimed in claim 1, wherein the number of diodes in said second series connection is selected so that a voltage at said other end of said second series connection may become $-V_F$, $V_F$ being a forward voltage of said diode in said second series connection, the number of diodes in each of said first and second series connections being the same.

8. A TTL-ECL signal level converter comprising: an input terminal receiving an input TTL signal; an input diode having a cathode connected to the input terminal; an input transistor having a collector connected to a positive power source, a base connected to an anode of the input diode and grounded through a first series connection of diodes and an emitter connected to a negative power source through a second series connection of diodes and a current source; a reference voltage source; a clamping transistor having a collector grounded, a base receiving the reference voltage and an emitter connected to a connection point of the second series connection and the current source; and a comparing means for comparing a voltage at the connection point of the second series connection and the current source with the reference voltage, the comparing means producing an output ECL signal as a result of the comparison.

9. A TTL-ECL signal level converter as claimed in claim 8; wherein the diodes in said first and second series connections are connected so as to be forward biased when said input TTL signal is at a high logic level, a number of the diodes in said second series connection being a number obtained by dividing a total voltage of the reference voltage and a threshold voltage for judging the logic level of said input TTL signal by a forward voltage of the diode in said second series connection, and a number of the diodes in said first series connection being the same number as that of the diodes in said second series connection.

10. A TTL-ECL signal level converter as claimed in claim 9, wherein the reference voltage is a negative voltage of twice of the forward voltage of the diode in said second series connection, the number of diodes in each of said first and second series connections being four, respectively.

11. A TTL-ECL signal level converter as claimed in claim 9, wherein the reference voltage is a negative voltage of twice of the forward voltage of the diode in said second series connection, the number of diodes in each of said first and second series connections being five, respectively.

* * * * *